United States Patent
Sakata et al.

(10) Patent No.: US 8,900,480 B2
(45) Date of Patent: Dec. 2, 2014

(54) CERAMIC COMPOSITE MATERIAL FOR LIGHT CONVERSION AND USE THEREOF

(75) Inventors: Shin-ichi Sakata, Ube (JP); Yoshiharu Waku, Ube (JP)

(73) Assignee: Ube Industries, Ltd. (JP)

( * ) Notice: Subject to any disclaimer, the term of this patent is extended or adjusted under 35 U.S.C. 154(b) by 811 days.

(21) Appl. No.: 10/542,569

(22) PCT Filed: Jan. 19, 2004

(86) PCT No.: PCT/JP2004/000371
§ 371 (c)(1),
(2), (4) Date: Jul. 18, 2005

(87) PCT Pub. No.: WO2004/065324
PCT Pub. Date: Aug. 5, 2004

(65) Prior Publication Data
US 2006/0124951 A1      Jun. 15, 2006

(30) Foreign Application Priority Data

Jan. 20, 2003   (JP) ................................ 2003-010887

(51) Int. Cl.
| | | |
|---|---|---|
| C09K 11/02 | (2006.01) | |
| C09K 11/08 | (2006.01) | |
| C09K 11/77 | (2006.01) | |
| H01J 1/62 | (2006.01) | |
| H01J 63/04 | (2006.01) | |
| C04B 35/44 | (2006.01) | |
| C04B 35/117 | (2006.01) | |
| C04B 35/626 | (2006.01) | |
| C04B 35/65 | (2006.01) | |
| C04B 35/653 | (2006.01) | |
| H01L 33/50 | (2010.01) | |

(52) U.S. Cl.
CPC .............. *C04B 35/117* (2013.01); *C04B 35/44* (2013.01); *C04B 2235/3225* (2013.01);

(Continued)

(58) Field of Classification Search
USPC ..................... 252/301.4 R–301.4 H; 313/503
See application file for complete search history.

(56) References Cited

U.S. PATENT DOCUMENTS

| | | | |
|---|---|---|---|
| 3,691,482 A | * | 9/1972 | Pinnow et al. ................ 359/305 |
| 5,004,948 A | | 4/1991 | Kinczel et al. |
| 5,484,752 A | | 1/1996 | Waku et al. |
| 5,569,547 A | | 10/1996 | Waku et al. |
| 5,902,763 A | | 5/1999 | Waku et al. |
| 5,981,415 A | * | 11/1999 | Waku et al. ..................... 501/80 |

(Continued)

FOREIGN PATENT DOCUMENTS

| | | |
|---|---|---|
| CN | 1268250 A | 9/2000 |
| EP | 0 816 537 A2 | 1/1998 |

(Continued)

OTHER PUBLICATIONS

Nakazawa. "Absorption and Emission of Light". Phosphor Handbook. Edited by Shigeo Shinoya. CRC Press LLC. 1999. p. 11.*

(Continued)

*Primary Examiner* — Matthew E Hoban
(74) *Attorney, Agent, or Firm* — DLA Piper LLP (US)

(57) ABSTRACT

A ceramic composite material for light conversion, which is a solidified body comprising two or more matrix phases with respective components being two or more oxides selected from the group consisting of metal oxides and complex oxides each produced from two or more metal oxides, wherein at least one of the matrix phases is a phosphor phase containing an activated oxide. The solidified body is preferably obtained by the unidirectional solidification method. The ceramic composite material for light conversion is excellent in brightness, light-mixing property, heat resistance and ultraviolet light resistance.

5 Claims, 7 Drawing Sheets

(52) U.S. Cl.
CPC ......... *C04B 2235/445* (2013.01); *H01L 33/502* (2013.01); *C04B 2235/3215* (2013.01); *C04B 2235/80* (2013.01); *C04B 35/62665* (2013.01); *C09K 11/0805* (2013.01); *C04B 2235/3222* (2013.01); *C04B 35/652* (2013.01); *C04B 35/653* (2013.01); *C04B 2235/3229* (2013.01); *C04B 2235/6581* (2013.01); *C04B 2235/3217* (2013.01)
USPC .................................. 252/301.4 R; 313/503

(56) References Cited

U.S. PATENT DOCUMENTS

2002/0003233 A1* 1/2002 Mueller-Mach et al. ....... 257/84

FOREIGN PATENT DOCUMENTS

| | | | |
|---|---|---|---|
| EP | 0 936 682 | A1 | 8/1999 |
| JP | 7-149597 | A | 6/1995 |
| JP | 7-187893 | A | 7/1995 |
| JP | 8-81257 | A | 3/1996 |
| JP | 8-253389 | A | 10/1996 |
| JP | 8-253390 | A | 10/1996 |
| JP | 9-67194 | A | 3/1997 |
| JP | 2000-208815 | A | 7/2000 |
| JP | 2000-272955 | A | 10/2000 |
| JP | 2001-328871 | A | 11/2001 |
| JP | 2002-252372 | | 9/2002 |
| JP | 2002-335010 | A | 11/2002 |

OTHER PUBLICATIONS

Triplicane A. Parthasarathy et al., "Deformation Behavior of an $Al_2O_3$—$Y_3Al_5O_{12}$ Eutectic Composite in Comparison with Sapphire and YAG," *J Am. Ceram. Soc*, vol. 76, No. 1, pp. 29-32, 1993.

Park, D.-Y. et al., "Fracture Behavior of Directionally Solidified $CeO_2$ and $Pr_2O_3$-doped $Y_3Al_5O_{12}/Al_2O_3$ Eutectic Composites," *Materials Science and Engineering*, 2002, vol. A332, pp. 276-284.

* cited by examiner

CERAMIC COMPOSITE MATERIAL FOR LIGHT CONVERSION AND USE THEREOF

TECHNICAL FIELD

This disclosure relates to a ceramic composite material, for light conversion, having a function of converting some irradiated light into light at a wavelength different from the irradiated light and at the same time, mixing the converted light, with the unconverted irradiated light to cause conversion into light having a color tone different from the irradiated light, and also relates to the use thereof.

BACKGROUND ART

With a recent practical implementation of a blue light-emitting diode, studies are being aggressively made to develop a white light source by utilizing this diode as the light emission source. White light is in very large demand as a light source for illumination and, in addition, is greatly advantageous in that a light-emitting diode has a low power consumption and ensures a long life, compared with existing white light sources.

According to this method, the blue light emitted from the blue light-emitting diode is converted into white light by using a material having a light conversion function, in which out of three primary light colors, the blue light is included in the light emitted from the blue light-emitting diode, but green light and red light must be emitted. For this purpose, a phosphor capable of absorbing light at a certain wavelength and emitting light at a wavelength different from the absorbed light is used.

With respect to the method for converting blue light of the blue light-emitting diode into white light, as described, for example, in Japanese Unexamined Patent Publication (Kokai) No. 2000-208815, a coating layer containing a phosphor capable of absorbing a part of the blue light and emitting yellow light, and a molded layer for mixing the blue light of the light source and the yellow light from the coating layer are provided at the front of a light-emitting device. Referring to FIG. 1, a coating layer 2 is present at the front of a light-emitting device 1, and a molded layer 3 is further provided thereon. In the Figure, 4 is an electrically conducting wire, and each of 5 and 6 is a lead. In this case, color mixing takes place not only in the molded layer 3 but also in the coating layer 2.

As for the coating layer employed in conventional techniques, a mixture of an epoxy resin and a YAG (Yttrium-aluminum-garnet) powder doped with a cerium compound is coated on a light-emitting device (see, Kokai No. 2000-208815). However, according to this method, uniform white light can be hardly obtained with good reproducibility because of difficulty in control for, for example, ensuring uniform mixing of the phosphor powder and the resin, or optimizing the thickness of coated film. Also, use of a phosphor powder having low transparency to light is an obstacle to the production of a high-brightness light-emitting diode. Furthermore, heat storage arises as a problem when high-intensity light is to be obtained, and the heat resistance and the ultraviolet light resistance of resins for the coating layer and molded layer become important problems.

In order to overcome these problems, a material of emitting yellow light by absorbing blue light emitted from the light-emitting diode, and at the same time, exhibiting excellent light mixing property and high heat resistance is necessary.

Thus, it could be advantageous to provide a ceramic composite material not only having a light conversion function, that is, a function of absorbing light at a certain wavelength and emitting light at a wavelength different from the absorbed light, but also ensuring high brightness and a good light mixing property as well as excellent resistance against heat and ultraviolet light.

SUMMARY

We thus provide the following:

(1) A ceramic composite material for light conversion, which is a solidified body comprising two or more matrix phases with respective components being two or more oxides selected from the group consisting of metal oxides and complex oxides each produced from two or more metal oxides, wherein at least one of the matrix phases is a phosphor phase containing an activated oxide.

(2) The ceramic composite material for light conversion as described in (1) above, wherein the solidified body is obtained by the solidification method.

(3) The ceramic composite material for light conversion as described in (2) above, wherein respective matrix phases are continuously and three-dimensionally disposed and entangled with each other.

(4) The ceramic composite material for light conversion as described in any one of (1) to (3) above, wherein the metal oxide is selected from the group consisting of $Al_2O_3$, MgO, $SiO_2$, $TiO_2$, $ZrO_2$, CaO, $Y_2O_3$, BaO, BeO, FeO, $Fe_2O_3$, MnO, CoO, $Nb_2O_5$, $Ta_2O_5$, $Cr_2O_3$, SrO, ZnO, NiO, $Li_2O$, $Ga_2O_3$, $HfO_2$, $ThO_2$, $UO_2$, $SnO_2$ and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$ and $Lu_2O_3$).

(5) The ceramic composite material for light conversion as described in any one of (1) to (3) above, wherein the complex oxide produced from a combination of two or more metal oxides is selected from the group consisting of $3Al_2O_3.2SiO_2$ (mullite), $MgO.Al_2O_3$, $Al_2O_3.TiO_2$, $BaO.6Al_2O_3$, $BaO.Al_2O_3$, $BeO.3Al_2O_3$, $BeO.Al_2O_3$, $3BeO.Al_2O_3$, $CaO.TiO_2$, $CaO.Nb_2O_3$, $CaO.ZrO_2$, $2CoO.TiO_2$, $FeAl_2O_4$, $MnAl_2O_4$, $3MgO.Y_2O_3$, $2MgO.SiO_2$, $MgCr_2O_4$, $MgO.TiO_2$, $MgO.Ta_2O_5$, $MnO.TiO_2$, $2MnO.TiO_2$, $3SrO.Al_2O_3$, $SrO.Al_2O_3$, $SrO.2Al_2O_3$, $SrO.6Al_2O_3$, $SrO.TiO_3$, $TiO_2.3Nb_2O_5$, $TiO_2.Nb_2O_5$, $3Y_2O_3.5Al_2O_3$, $2Y_2O_3.Al_2O_3$, $2MgO.2Al_2O_3.5SiO_2$, $LaAlO_3$, $CeAlO_3$, $PrAlO_3$, $NdAlO_3$, $SmAlO_3$, $EuAlO_3$, $GdAlO_3$, $DyAlO_3$, $Yb_4Al_2O_9$, $Er_3Al_5O_{12}$, $11Al_2O_3.La_2O_3$, $11Al_2O_3.Nd_2O_3$, $11Al_2O_3.Pr_2O_3$, $EuAl_{11}O_{18}$, $2Gd_2O_3.Al_2O_3$, $11Al_2O_3.Sm_2O_3$, $Yb_3Al_5O_{12}$, $CeAl_{11}O_{18}$ and $Er_4Al_2O_9$.

(6) The ceramic composite material for light conversion as described in any one of (1) to (3) above, wherein the phases constituting the matrix are two phases of $\alpha$-$Al_2O_3$ phase and $Y_3Al_5O_{12}$ phase.

(7) The ceramic composite material for light conversion as described in any one of (1) to (6) above, wherein the activating element is cerium.

(8) A light conversion method comprising converting the color of light emitted from a light-emitting diode into a different color by using the ceramic composite material for light conversion described in any one of (1) to (7) above.

(9) A light conversion method comprising converging blue light into white light by using a ceramic composite material for light conversion, the ceramic composite material comprising a matrix in which the constituent phases are an $\alpha$-$Al_2O_3$ phase and a $Y_3Al_5O_{12}$ phase and the $Y_3Al_5O_{12}$ phase is a phosphor activated with cerium.

(10) A light-emitting diode comprising a light-emitting diode chip and the ceramic composite material for light conversion described in any one Of (1) to (7) above.

(11) The light-emitting diode as described in (10) above, wherein the ceramic composite material for light conversion contains a matrix phase capable of being excited by visible light emitted from the light-emitting diode chip and emitting fluorescence of visible light at a wavelength longer than the excitation wavelength.

(12) The light-emitting diode as described in (10) or (11) above, wherein the ceramic composite material for light conversion converts blue light emitted from the light-emitting diode chip into white light

DETAILED DESCRIPTION

Figure 1:
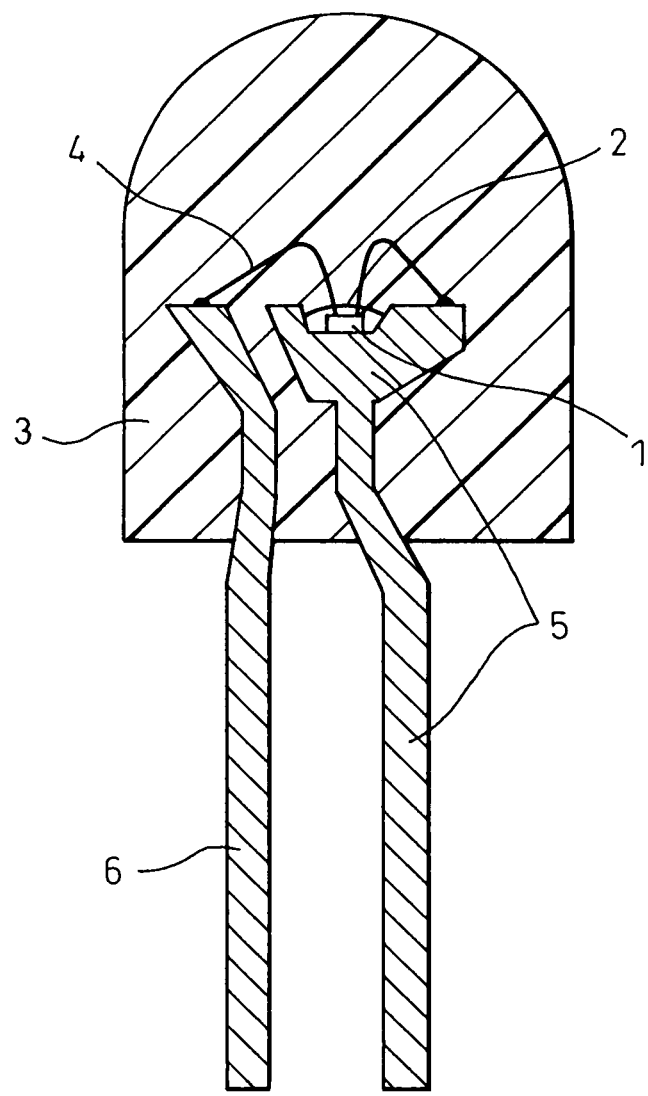
FIG. 1 is a cross-sectional view showing a conventional light-emitting diode.

In our ceramic composite materials, a uniform texture free of colony and voids is provided by controlling the production conditions. Also, a grain boundary phase which is present in a general sintered body obtained by pressure-sintering a mixed powder prepared to comprise predetermined components is not present. Furthermore, a ceramic composite material where the oxides or complex oxides constituting the composite material each consists of single crystal/single crystal, single crystal/polycrystal or polycrystal/polycrystal can also be obtained by controlling the production conditions. The "single crystal" means a crystal structure in such a state that only diffraction peaks from a specific crystal plane are observed by the X-ray diffraction. In addition, the optical property, mechanical property and thermal property may also be changed by dissolving or extracting an oxide other than the constituent oxide to one of the phases constituting the composite material or by presenting it at the interface.

The ceramic composite material has a structure where the constituent oxide phases are homogeneously and continuously connected in a micro scale. The size of each phase can be controlled by changing the solidification conditions. It is generally from 1 to 50 μm.

The ceramic composite material is produced by melting raw material oxides and then solidifying them. For example, the solidified body may be obtained by a simple and easy method of charging the melt into a crucible kept at a predetermined temperature and then cooling and solidifying it while controlling the cooling temperature. The unidirectional solidification method is most preferred. The process thereof is roughly described below.

A metal oxide for forming a matrix phase, and a metal oxide as a fluorescent emitter are mixed at a desired composition ratio to prepare a mixed powder. The mixing method is not particularly limited and either a dry mixing method or a wet mixing method can be employed. Subsequently, the mixed powder is heated and melted at a temperature sufficient to cause the charged raw materials to melt by using a well-known melting furnace such as arc melting furnace. For example, in the case of $Al_2O_3$ and $Er_2O_3$, the mixed powder is heated and melted at 1,900 to 2,000° C.

The obtained melt is as-is charged into a crucible and subjected to unidirectional solidification, or after the melt is once solidified, the resulting lump is ground, charged into a crucible and again heated/melted and then the obtained molten liquid is subjected to unidirectional solidification by withdrawing the crucible from the heating zone of the melting furnace. The unidirectional solidification of the melt may be performed under atmospheric pressure but, to obtain a material with fewer defects in the crystal phases, this is preferably performed under a pressure of 4,000 Pa or less, more preferably 0.13 Pa ($10^{-3}$ Torr) or less.

The withdrawing rate of the crucible from the heating zone, that is, the solidification rate of the melt, is set to an appropriate value according to the melt composition. The withdrawing rate is usually 50 mm/hour or less, preferably from 1 to 20 mm/hour.

With respect to the apparatus used for the unidirectional solidification, a well-known apparatus may be used, where a crucible is vertically housed in a cylindrical container disposed in the vertical direction, an induction coil for heating is fixed at the exterior of the cylindrical container at the center part, and a vacuum pump for depressurizing the space in the container is also disposed.

The phosphor constituting at least one matrix phase of the ceramic composite material for light conversion can be obtained by adding an activating element to a metal oxide or a complex oxide. Such a phosphor material is known and need not be additionally described in particular. In the ceramic composite material for use in the ceramic composite material for light conversion, at least one matrix phase is made to function as a phosphor phase, and fundamentally, the ceramic composite material is the same as those disclosed, for example, in Japanese Unexamined Patent Publication (Kokai) Nos. 7-149597, 7-187893, 8-81257, 8-253389, 8-253390 and 9-67194 previously filed by the applicant (assignee) and their corresponding U.S. applications (U.S. Pat. Nos. 5,569, 547, 5,484,752 and 5,902,763), and can be produced by the production methods disclosed in these patent applications (patents). The contents disclosed in these patent applications and patents are incorporated herein by reference.

A block in a required shape is cut out from the resulting solidified body and used as a ceramic composite material substrate of converting light at a certain wavelength into light having the objective other color hue.

With respect to the oxide species for constituting the matrix phases, various combinations may be employed, but a ceramic selected from the group consisting of metal oxides and complex oxides produced from two or more metal oxides is preferred.

Examples of the metal oxide include aluminum oxide ($Al_2O_3$), zirconium oxide ($ZrO_2$), magnesium oxide (MgO), silicon oxide ($SiO_2$), titanium oxide ($TiO_2$), barium oxide (BaO), beryllium oxide (BeO), calcium oxide (CaO), chromium oxide ($Cr_2O_3$) and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$).

Examples of the complex oxide produced from these metal oxides include $LaAlO_3$, $CeAlO_3$, $PrAlO_3$, $NdAlO_3$, $SmAlO_3$, $EuAlO_3$, $GdAlO_3$, $DyAlO_3$, $ErAlO_3$, $Yb_4Al_2O_9$, $Y_3Al_5O_{12}$, $Er_3Al_5O_{12}$, $11Al_2O_3 \cdot La_2O_3$, $11Al_2O_3 \cdot Nd_2O_3$, $3Dy_2O_3 \cdot 5Al_2O_3$, $2Dy_2O_3 \cdot Al_2O_3$, $11Al_2O_3 \cdot Pr_2O_3$, $EuAl_{11}O_{18}$, $2Gd_2O_3 \cdot Al_2O_3$, $11Al_2O_3 \cdot Sm_2O_3$, $Yb_3Al_5O_{12}$, $CeAl_{11}O_{18}$ and $Er_4Al_2O_9$.

For example, in the case of a combination of $Al_2O_3$ and $Gd_2O_3$, a eutectic crystal is formed by $Al_2O_3$: 78 mol % and $Gd_2O_3$: 22 mol % and therefore, a ceramic composite material comprising an $Al_2O_3$ phase and a perovskite-structure $GdAlO_3$ phase which is a complex oxide of $Al_2O_3$ and $Gd_2O_3$ can be obtained. Similarly, the fractions of $\alpha$-$Al_2O_3$ and $GdAlO_3$ can be changed within the range from about 20 to 80 vol % and from about 80 to 20 vol %, respectively other examples of the complex oxide produced from two or more metal oxides and having a perovskite structure include $LaAlO_3$, $CeAlO_3$, $PrAlO_3$, $NdAlO_3$, $SmAlO_3$, $EuAlO_3$ and $DyAlO_3$. When any one of these complex oxides constitutes the composite material, a ceramic composite material having a fine texture and a large mechanical strength can be obtained.

Also, in the case of a combination of $Al_2O_3$ and $Er_2O_3$, a eutectic crystal is formed by $Al_2O_3$: 81.1 mol % and $Er_2O_3$: 18.9 mol % and therefore, a ceramic composite material comprising an $Al_2O_3$ phase and a garnet-structure $Er_3Al_5O_{12}$ phase which is a complex oxide of $Al_2O_3$ and $Er_2O_3$ can be obtained. Similarly, the fractions of $\alpha$-$Al_2O_3$ and $Er_3Al_5O_{12}$ can be changed in the range from about 20 to 80 vol % and from about 80 to 20 vol %, respectively. Other examples of the complex oxide produced from two or more metal oxide and having a garnet structure include $Yb_3Al_5O_{12}$. When any one of these complex oxides constitutes the composite material, a ceramic composite material having a high creep strength can be obtained.

Among these, a combination of $Al_2O_3$ and a rare earth element oxide is preferred. This is because a material excellent not only in the mechanical characteristics but also in the optical characteristics is provided and also because a composite material in which respective matrix phases are three-dimensionally and continuously entangled is readily obtained by the unidirectional solidification method as described later and a matrix phase allowing for stable existence of a phosphor comprising a rare earth metal oxide is formed. In particular, a composite material comprising $Al_2O_3$ and $Y_3Al_5O_{12}$ two matrix phases produced from $Al_2O_3$ and $Y_2O_3$ is preferred.

The phosphor is obtained by adding an activating element to the above-described metal oxide or complex oxide.

The activating element (phosphor seed) incorporated into the matrix phase is appropriately selected according to the wavelength of light source and the color hue required by converting the color of the light source. For example, for converting blue light at 430 to 480 nm of the blue light-emitting diode into white light, it is preferred to use cerium as the activating element and add an oxide of cerium. Of course, the color can be adjusted by adding a plurality of elements, for example, cerium and another phosphor seed. The activating element except for cerium varies depending on the kind of the matrix oxide but, for example, terbium, europium, manganese, chromium, neodymium and dysprosium are used.

For adding an activating element (phosphor seed) to the matrix oxide phase, this may be usually attained by adding an oxide of the activating element in a predetermined amount.

The ceramic composite material comprises a few kinds of matrix phases and the element added for the activation is considered to be existed according to the distribution coefficient and present in each matrix phase. The phase of the emitted fluorescence depends on the components. For example, a composite material comprising alumina ($Al_2O_3$) and $Y_3Al_5O_{12}$ matrix phases is formed from $Al_2O_3$ and $Y_2O_3$. Fluorescence is emitted from the $Y_3Al_5O_{12}$ phase and this phase is considered to be a cerium-activated phosphor represented by $Y_3Al_5O_{12}$:Ce. According to the distribution coefficient, the Ce in the composite is mostly existed in the $Y_3Al_5O_{12}$ phase and scarcely present in the alumina phase. The phase in which contains the activating elements cannot always become a phosphor, cannot be indiscriminately said to become a phosphor, because the formation of a phosphor depends on the components in the ceramic composite material, at least one matrix phase is a phase for emitting fluorescence.

Each of the alumina and $Y_3Al_5O_{12}$ is transparent, and the matrix phase comprising a cerium-activated phosphor represented by $Y_3Al_5O_{12}$:Ce is also fundamentally transparent. In the composite material comprising alumina ($Al_2O_3$) and $Y_3Al_5O_{12}$:Ce matrix phases, the blue light entering and transmitted through the alumina phase is blue light as-is, but a part of the blue light entered the $Y_3Al_5O_{12}$:Ce phase is changed to yellow light. These lights are mixed in this composite, whereby the transmitted light appears as a white light.

Figure 3:
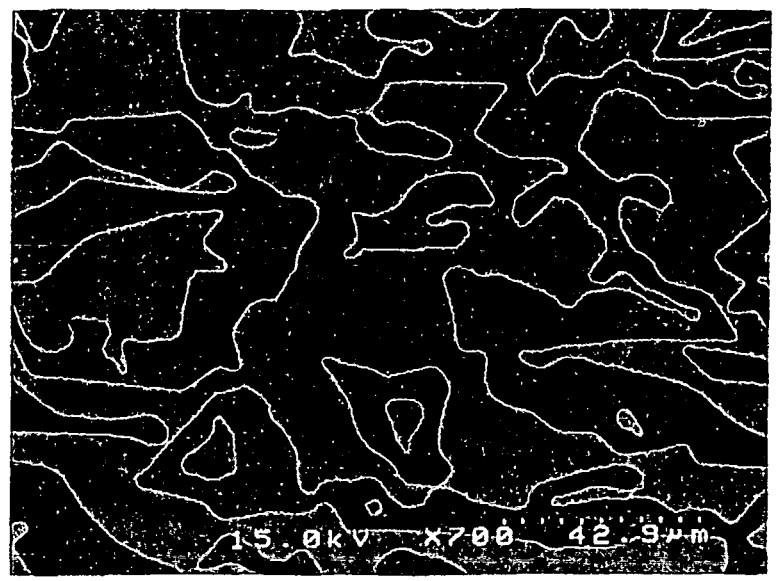
FIG. 3 is an electron microphotograph showing the texture of a material obtained in an Example.
Figure 4:
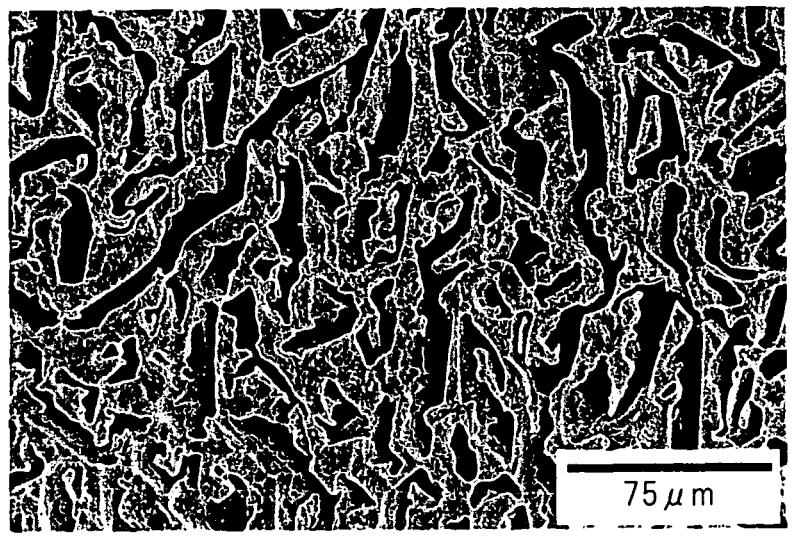
FIG. 4 is an electron microphotograph showing the structure of the YAG phase in a material obtained in an Example.

By the unidirectional solidification method, a composite material having a structure that respective matrix phases are three-dimensionally and complicatedly entangled each other can be obtained (see, for example, FIGS. 3 and 4). Particularly, when $Al_2O_3$ and a rare earth metal oxide are used, a composite material having such a structure is easily obtained. This structure is advantageous as a light converting material, because in addition to high transparency of the $Al_2O_3$ phase, the $Y_3Al_5O_{12}$:Ce matrix phase acts as a uniform phosphor as a whole (the activating element cerium which predominates the light emission is uniformly distributed in the entire matrix phase on the atomic level). And by virtue of the structure where these phases are three-dimensionally and complicatedly entangled, high brightness and effective color mixing of transmitted light and fluorescence are realized.

Furthermore, in the case of a material obtained by mixing a phosphor powder and a resin, light scattering occurs on the powder surface, on the other hand, the composite material is free from such light scattering so that the light transmittance can be high and the light (blue light) of the light-emitting diode can be efficiently utilized.

In addition, the composite material is a ceramic material having a high melting point and, therefore, is advantageous in that the thermal stability is very high and, in turn, the problem of heat resistance as in resin materials does not arise and also in that the problem of deterioration due to ultraviolet light does not occur.

Accordingly, the ceramic composite material is a ceramic composite material not only having a conversion function, that is, a function of absorbing light at a certain wavelength and emitting fluorescence which is light at a wavelength different from that of the light absorbed, but also being excellent in brightness, light transmittance, light mixing property, light usability, heat resistance and ultraviolet resistance, and this is a ceramic composite material for light conversion suitably usable for the purpose of converting color of a light-emitting diode.

Figure 2:
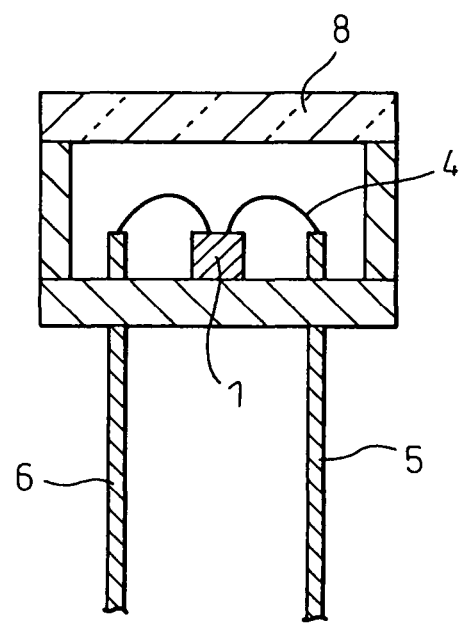
FIG. 2 is a cross-sectional view showing an example of the light-emitting diode.

In the case of using the ceramic composite material for light conversion in a light-emitting diode, the light-emitting diode may be fabricated, for example, as shown in FIG. 2, by disposing the ceramic composite material 8 for light conversion at the front of a light-emitting diode (LED) chip 1. In FIG. 2, similarly to FIG. 1, 4 is an electrically conducting wire and each of 5 and 6 is a lead. The chip (element) 1 may also be disposed to come into contact with the ceramic composite material 8 for light conversion, and this seems to be more preferred in view of heat radiation of the element. The shape of the container or board can be changed as needed, and the construction material can also be selected as needed.

Our materials are described in greater detail below by referring to specific examples.

EXAMPLES

Example 1

An $\alpha$-$Al_2O_3$ powder (purity: 99.99%) and a $Y_2O_3$ powder (purity: 99.999%) were mixed at a ratio of 82:18 by mol and a $CeO_2$ powder (purity: 99.99%) was mixed to have a ratio of 0.01 mol per mol of $Y_3Al_5O_{12}$ produced by the reaction of oxides charged. These powders were wet-mixed in ethanol by a ball mill for 16 hours and, then, the ethanol was removed by using an evaporator to obtain a raw material powder. This raw material powder was preliminarily melted in a vacuum furnace and used as a raw material for the unidirectional solidification.

The obtained raw material was charged into a molybdenum crucible and, then the crucible was set in a unidirectional solidification apparatus. The raw material was melted under a pressure of $1.33 \times 10^{-3}$ Pa ($10^{-5}$ Torr). In the same atmosphere, the crucible was moved down at a speed of 5 mm/hour, whereby a solidified body was obtained. This solidified body took on a yellow color.

FIG. 3 shows a cross-sectional texture perpendicular to the solidification direction of the solidified body. The white area is the $Y_3Al_5O_{12}$ (more exactly $Y_3Al_5O_{12}$:Ce) phase and the black area is the $Al_2O_3$ phase. It is seen that this solidified body is free from a colony or a grain boundary phase and has a uniform texture without any the presence of air bubbles or voids.

FIG. 4 is an electron microphotograph showing the three-dimensional structure of the $Y_3Al_5O_{12}$ phase perpendicular to the solidification direction in a sample obtained by cutting out a specimen in the same direction and heating it together with a carbon powder at 1,600° C. to remove the $Al_2O_3$ phase in the vicinity of the surface of the specimen.

The X-ray diffraction from the surface nearly perpendicular to the solidification direction was observed, as a result, only diffraction peaks assigned to (110) face of YAG and (110) face of $\alpha$-$Al_2O_3$, respectively, were observed.

It is seen from these results that in this composite material, two phases of $\alpha$-$Al_2O_3$ single crystal phase and $Y_3Al_5O_{12}$ single crystal phase are present and these phases are continuously and three-dimensionally disposed and entangled with each other.

Figure 5:
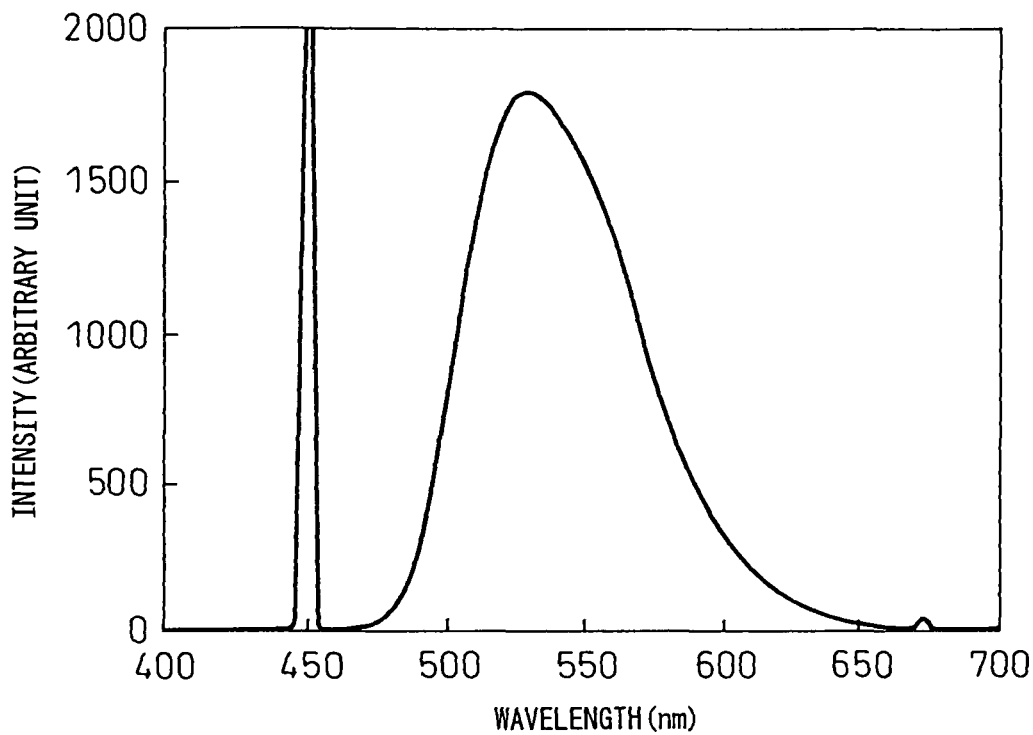
FIG. 5 is a spectrum showing fluorescent characteristics of the material obtained in Example 1.

From the solidified body, a 1 mm-thick substrate was cut out in the direction perpendicular to the solidification direction. The fluorescent characteristics of this material were evaluated by a fluorescence evaluating apparatus. The results are shown in FIG. 5. This material was found to have yellow fluorescence having a wide spectrum with a peak at about 530 nm when blue light at about 450 nm was irradiated. Accordingly, the $Y_3Al_5O_{12}$ phase is a phosphor represented by $Y_3Al_5O_{12}$:Ce.

Figure 6:
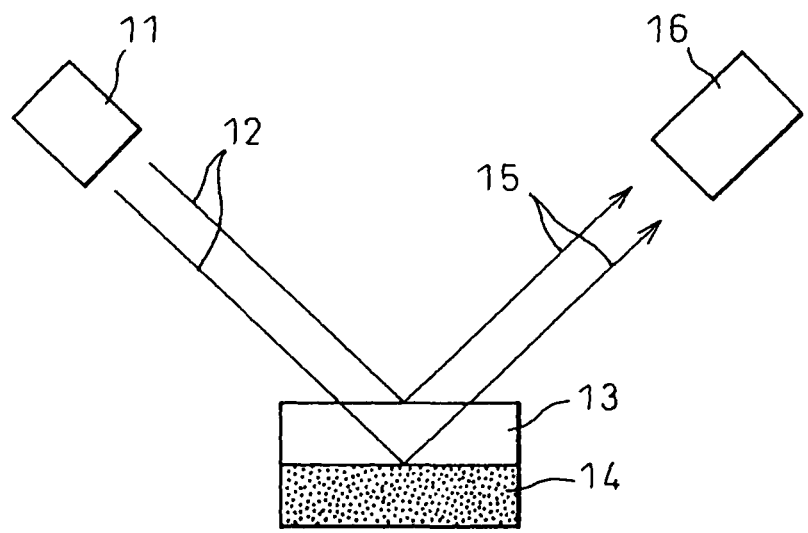
FIG. 6 is a view roughly showing the method for measuring fluorescent characteristics.

Thereafter, the measurement for confirming the mixing property with blue light was performed by the method shown in FIG. 6. A mirror 14 was placed on the lower side of a specimen 13 so that the light transmitted through the specimen could return to the detector. When the mirror is arranged in this way, the light reflected from the surface or inside of the specimen enters the detector 16. The emitted light 12 used was blue light at 450 nm from a light source 11. As, for the thickness of specimen, four kinds of 0.1 mm, 0.2 mm, 0.5 mm and 1.0 mm were used.

Figure 7:
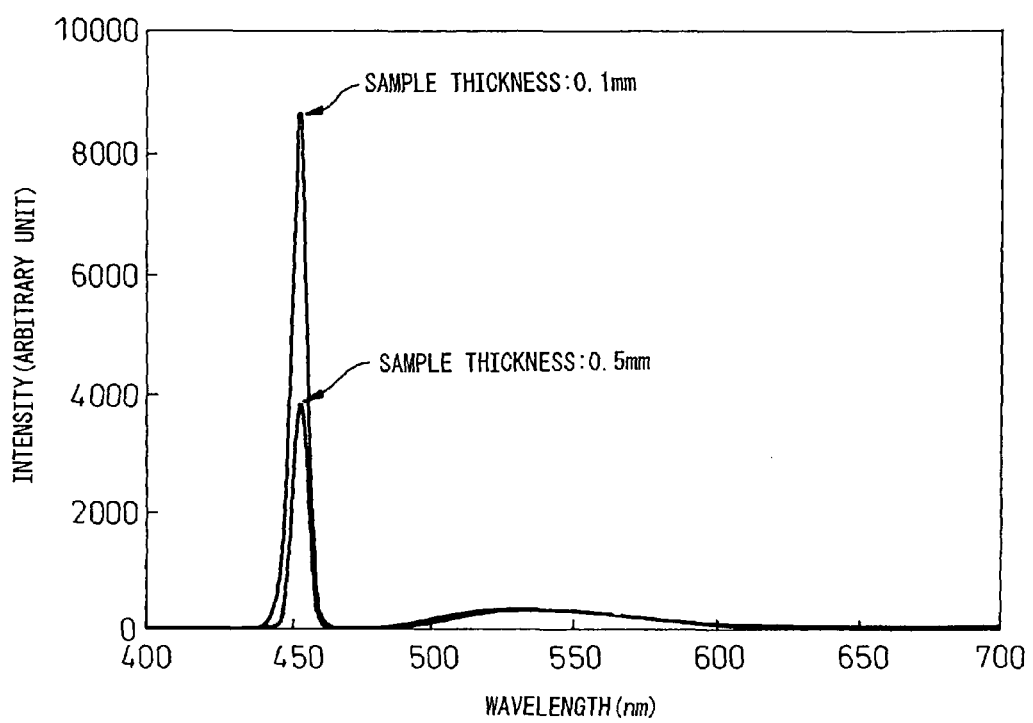
FIG. 7 is a view showing detection examples in a detector.

FIG. 7 shows detection examples in the detector. In this Figure, two specimens differing in the thickness are used and it is seen that as the specimen thickness increases, the blue light at 450 nm decreases.

Figure 8:
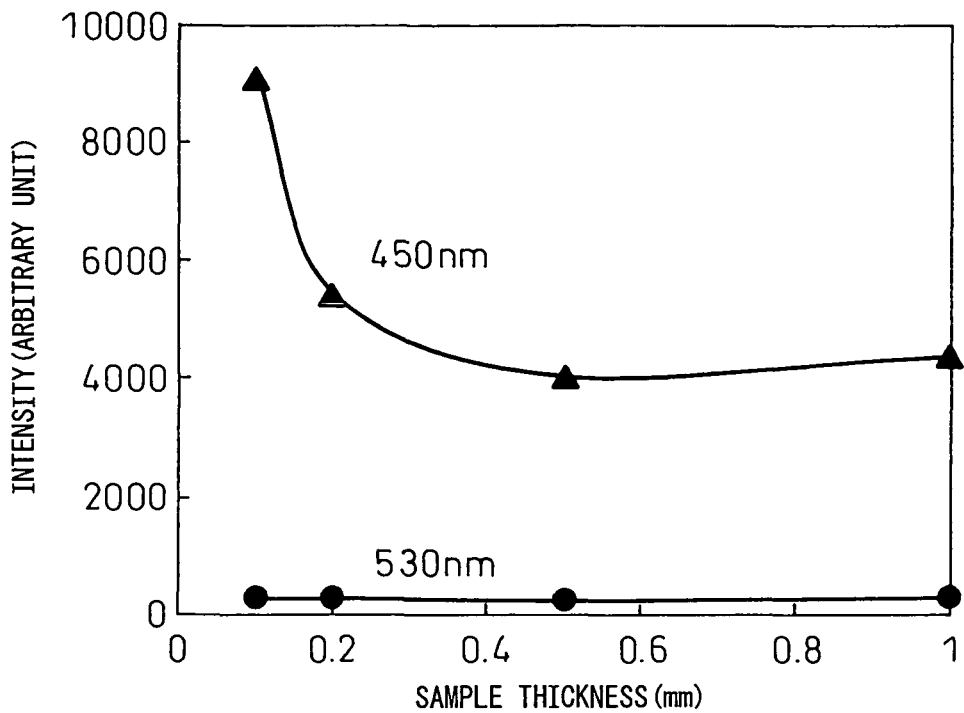
FIG. 8 is a view showing an example of the relationship between the specimen thickness and the fluorescent characteristics of a light converting material.
Figure 9:
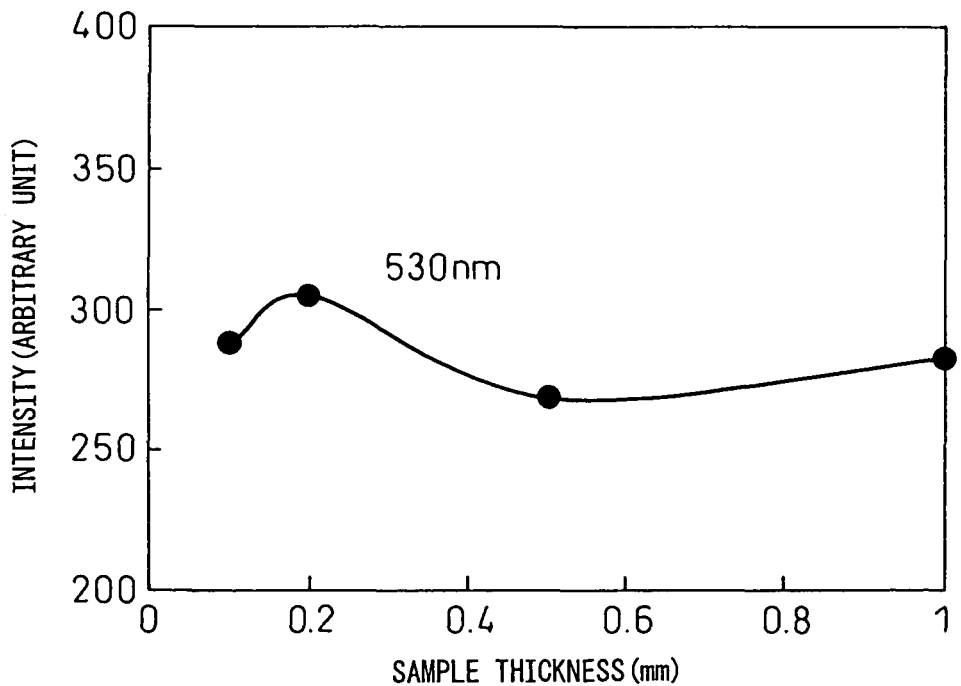
FIG. 9 is a view showing an example of the relationship between the specimen thickness and the fluorescent characteristics of a light converting material. The scale for light of 530 nm is enlarged.

FIG. 8 shows the relationship of the specimen thickness with the blue light intensity and with the yellow fluorescence intensity. As for the yellow fluorescence, FIG. 9 shows an enlarged view by changing the scale on the ordinate. The blue light intensity decreases as the specimen thickness increases but becomes almost constant at a thickness of 0.5 mm or more. On the other hand, the yellow fluorescence intensity increases as the specimen thickness increases, and after reaching the maximum value, the intensity decreases and similarly to blue light, becomes almost constant at a thickness of 0.5 mm or more. The reason why the measured values become constant in the region having a large specimen thickness is because the reflected light of blue light from the specimen surface and the scattered light of yellow fluorescence generated in the phase at a depth less than a certain value from the surface are measured. This reveals that, in the case of a thick specimen, the incident light is absorbed in the specimen to cause wavelength conversion and is not transmitted through the specimen and on the contrary, in the case of a thin specimen, a part of the incident light is transmitted through the specimen and reflected on the mirror and a part of the reflected light again comes out from the specimen.

As seen from these observation results, this material transmits the incident blue light and at the same time, converts a part of the blue light into yellow light having a wide spectrum showing a peak in the vicinity of 530 nm, and these two lights are mixed to emit white light. It is also known that the color can be adjusted by controlling the thickness of the material.

Example 2

Figure 10:
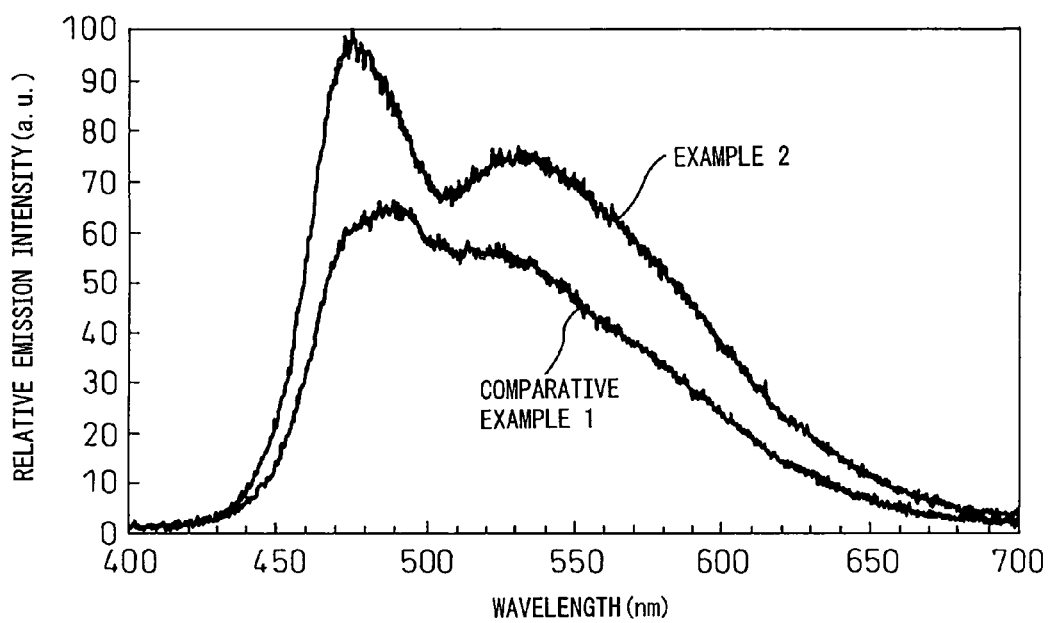
FIG. 10 is a spectrum showing fluorescent characteristics of the materials obtained in Example 2 and the Comparative Example.

From the ceramic composite material for light conversion produced in Example 1, a thin plate was cut out by a diamond cutter. This thin plate was processed to produce a disc-like specimen mountable on a light-emitting diode shown in FIG. 2, and a light-emitting diode was fabricated. The wavelength of the blue light-emitting diode chip used was 470 nm. FIG. 10 shows a light emission spectrum of the thus-obtained white light-emitting diode. Blue light at about 470 nm and light at 530 nm emitted from the ceramic composite material for light conversion were observed.

Furthermore, the color was measured by placing this light-emitting diode in an integrating sphere. As a result, the color of emitted light had CIE chromaticity coordinates of x=0.27 and y=0.34 and was verified to be a white color.

Comparative Example 1

$Al_2O_3$ (purity: 99.99%) and $Y_2O_3$ (purity: 99.999%) were mixed by the method described in Example 1 to give a Ce activation amount of 0.03 mol per mol of $Y_3Al_5O_{12}$, and dried to obtain a raw material. Thereto, 5 parts by weight of barium fluoride ($BaF_2$) was mixed as a flux per 100 parts by weight of the raw material and the mixture was charged into an alumina crucible and fired at 1,600° C. for 1 hour in air. After the crucible was returned to room temperature, the specimen was taken out therefrom and washed with a nitric acid solution to remove the flux. Thereafter, 40 parts by weight of the thus Ce-activated YAG powder was kneaded with 100 parts by weight of an epoxy resin, and the resin was hardened at 120° C. for 1 hour and at 150° C. for 4 hours to, obtain a compact. This compact was worked into a disc and a light-emitting diode shown in FIG. 2 was fabricated. The thickness of the disc was adjusted so that the light-emitting diode could emit light having the same color as that an Example 2. The thickness of the disc determined in this way was almost the same as the thickness of the ceramic composite material disc of Example 2. The color of the light-emitting diode had CIE chromaticity coordinates of x=0.27 and y=0.36. The radiation energy of the thus-fabricated light-emitting diode was measured in the range from 380 to 780 nm by using an integrating sphere. Also, the radiation energy of the light-emitting diode of Example 2 was measured in the same manner. FIG. 10 shows the obtained light emission, spectra of these white light-emitting diodes. As a result, the radiation energy of Example 2 was about 1.5 times that of Comparative Example 1. This reveals that the ceramic composite material for wavelength conversion can transmit a larger quantity of light and can produce a high-brightness light-emitting diode.

INDUSTRIAL APPLICABILITY

The ceramic composite material for light conversion is excellent in brightness, light mixing property, heat resistance and ultraviolet resistance. In particular, the ceramic composite material for light conversion is excellent in the performance of obtaining white light from blue light and therefore, has a high practical value as a light source for illumination by making good use of the low power-consumption and long life of a light-emitting diode.

The invention claimed is:

1. A white light emitting device, comprising:
A) a light emitting element which emits a first light having a first wavelength, and
B) a plate-shaped light conversion member located on or above the light emitting element, and having a thickness of less than 1 mm,
said light conversion member being a unitary body consisting of a ceramic composite material, said ceramic composite being a solidified body consisting of i) a first matrix phase, ii) a second matrix phase, said first and second matrix phases being continuously and three-dimensionally disposed and entangled with each other, and iii) substantially free of a grain boundary between said first and second matrix phases,
said first matrix phase being a phosphor phase that absorbs said first light, emits fluorescence which is a second light having a wavelength different from said first light, and transmits said first light and said second light, said phosphor phase consisting of Ce-activated $Y_3Al_5O_{12}$,
said second matrix phase being a non-phosphor phase that transmits said first light, mixes said first light and said second light to form mixed white light, and transmits said mixed white light, said non-phosphor phase consisting of $\alpha$-$Al_2O_3$,
whereby light scattering is substantially prevented at an interface between said first and second matrixes, and
said light conversion member has a higher light transmittance, a more effective color mixing, a higher light conversion efficiency, a higher brightness, a higher heat resistance and a higher ultraviolet ray resistance in comparison to a light conversion member comprising a powder of said phosphor phase dispersed in a resin.

2. The white light emitting device as claimed in claim 1, wherein said ceramic composite material comprises a matrix phase capable of being excited by visible light and emitting fluorescence of visible light at a wavelength longer than the excitation wavelength.

3. The white light emitting device as claimed in claim 1 or 2, wherein said ceramic composite material converts blue light into white light.

4. The white light emitting device as claimed in claim 1, wherein the solidified body is obtained by the unidirectional solidification method.

5. A white light emitting device, comprising:
A) a blue light emitting element emitting blue light, and
B) a plate-shaped light conversion member located on or above the light emitting element and having a thickness of less than 1 mm,
said light conversion member being a unitary body consisting of a ceramic composite material, said ceramic composite material being a solidified body consisting of i) a first matrix phase, ii) a second matrix phase, said first and second matrix phases being continuously and three-dimensionally disposed and entangled with each other, and iii) substantially free of a grain boundary between said first and second matrix phases,
said first matrix phase being a phosphor phase that absorbs said blue light and emits fluorescence which is yellow light, and transmit said blue light and said yellow light, said phosphor phase consisting of Ce-activated $Y_3Al_5O_1$,
said second matrix phase being a non-phosphor phase that transmits said blue light, mixes said blue light and said yellow light to form mixed white light, and transmits said mixed white light, said non-phosphor phase consisting of $\alpha$-$Al_2O_3$,
whereby light scattering is substantially prevented at an interface between said first and second matrixes, and
said light conversion member has a higher light transmittance, a more effective color mixing, a higher light conversion efficiency, a higher brightness, a higher heat resistance and a higher ultraviolet ray resistance in comparison to a light conversion member comprising a powder of said phosphor phase dispersed in a resin.

* * * * *